United States Patent
Yokozeki et al.

(10) Patent No.: US 11,973,316 B2
(45) Date of Patent: Apr. 30, 2024

(54) VERTICAL CAVITY SURFACE EMITTING LASER ELEMENT AND ELECTRONIC APPARATUS

(71) Applicant: SONY CORPORATION, Tokyo (JP)

(72) Inventors: Mikihiro Yokozeki, Kanagawa (JP); Rintaro Koda, Tokyo (JP); Shunsuke Kono, Tokyo (JP); Katsunori Yanashima, Kanagawa (JP); Kota Tokuda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 842 days.

(21) Appl. No.: 16/982,434

(22) PCT Filed: Feb. 20, 2019

(86) PCT No.: PCT/JP2019/006247
§ 371 (c)(1),
(2) Date: Sep. 18, 2020

(87) PCT Pub. No.: WO2019/187809
PCT Pub. Date: Oct. 3, 2019

(65) Prior Publication Data
US 2021/0057882 A1    Feb. 25, 2021

(30) Foreign Application Priority Data
Mar. 28, 2018   (JP) ................. 2018-061492

(51) Int. Cl.
*H01S 5/183* (2006.01)
*H01S 5/042* (2006.01)
(Continued)

(52) U.S. Cl.
CPC ........ *H01S 5/18311* (2013.01); *H01S 5/2009* (2013.01); *H01S 5/3054* (2013.01);
(Continued)

(58) Field of Classification Search
CPC . H01S 5/18311; H01S 5/2009; H01S 5/18308
See application file for complete search history.

(56) References Cited

U.S. PATENT DOCUMENTS 5,048,035 A * 9/1991 Sugawara ............. H01L 33/145
                                                257/E33.07
5,991,321 A * 11/1999 Duggan .................... H01S 5/20
                                                372/45.01
(Continued)

FOREIGN PATENT DOCUMENTS

EP          3179581 A1      6/2017
JP       H07288338 A       10/1995
(Continued)

OTHER PUBLICATIONS

International Search Report and Written Opinion of PCT Application No. PCT/JP2019/006247, dated Apr. 23, 2019, 08 pages of ISRWO.

*Primary Examiner* — Joshua King
(74) *Attorney, Agent, or Firm* — CHIP LAW GROUP

(57) ABSTRACT

[Object] To provide a vertical cavity surface emitting laser element and an electronic apparatus that have high light emission efficiency. [Solving Means] A vertical cavity surface emitting laser element according to the present technology includes: an active layer; a first cladding layer; and an intermediate layer. The first cladding layer is provided on the active layer. The intermediate layer is provided on the first cladding layer, electrons in the intermediate layer having potential higher than potential of electrons in the first cladding layer, holes in the intermediate layer having potential higher than potential of holes in the first cladding layer.

14 Claims, 10 Drawing Sheets

(51) Int. Cl.
*H01S 5/20* (2006.01)
*H01S 5/30* (2006.01)
*H01S 5/343* (2006.01)
*H01S 5/10* (2021.01)

(52) U.S. Cl.
CPC ......... *H01S 5/04256* (2019.08); *H01S 5/1039* (2013.01); *H01S 5/34326* (2013.01)

(56) References Cited

U.S. PATENT DOCUMENTS

| | | | |
|---|---|---|---|
| 6,785,311 B1 * | 8/2004 | Najda | B82Y 20/00 257/190 |
| 7,767,480 B1 | 8/2010 | Pickrell et al. | |
| 8,228,964 B2 * | 7/2012 | Sekiguchi | H01S 5/18311 372/50.12 |
| 2009/0296768 A1 * | 12/2009 | Hara | B82Y 20/00 372/50.124 |
| 2010/0020835 A1 * | 1/2010 | Anan | H01S 5/18308 372/45.01 |
| 2011/0002353 A1 * | 1/2011 | Sekiguchi | B82Y 20/00 372/46.01 |
| 2011/0176122 A1 * | 7/2011 | Kaminishi | H01S 5/18311 359/205.1 |
| 2011/0254471 A1 * | 10/2011 | Bahir | B82Y 30/00 977/890 |
| 2011/0293331 A1 * | 12/2011 | Inao | H01S 5/3022 372/46.013 |
| 2014/0227007 A1 | 8/2014 | Inao et al. | |
| 2016/0248228 A1 * | 8/2016 | Kondo | G02B 26/10 |
| 2017/0168412 A1 | 6/2017 | Harada et al. | |

FOREIGN PATENT DOCUMENTS

| | | | |
|---|---|---|---|
| JP | 10256665 A | * | 9/1998 |
| JP | 11-177183 A | | 7/1999 |
| JP | H11243250 A | | 9/1999 |
| JP | 2001223384 A | | 8/2001 |
| JP | 2003-017813 A | | 1/2003 |
| JP | 2008227469 A | | 9/2008 |
| JP | 2011-249557 A | | 12/2011 |
| JP | 2014022523 A | * | 2/2014 |
| JP | 2017-108038 A | | 6/2017 |
| WO | 2009/047901 A1 | | 4/2009 |

* cited by examiner

| | Layer | Film thickness | |
|---|---|---|---|
| 112 { 112b | SiN | $0.25\lambda$ | |
| 112 { 112a | SiO$_2$ | $0.25\lambda$ | |
| 109 | p-DBR layer<br>p-Al$_{0.9}$GaAs / p-Al$_{0.5}$GaAs | Approximately $25 \sim 35\lambda$ | |
| 108 | AlAs constriction layer | Approximately 10~40nm | |
| 107 { 107b | (Al$_{0.7}$Ga)$_{0.5}$InP p-cladding layer | Approximately $0.1 \sim 0.5\lambda$ | |
| 107 { 107a | (Al$_{0.3}$Ga)$_{0.5}$InP p-cladding layer<br>$0 \leq$ Thickness | Approximately $0.1 \sim 0.3\lambda$ | Intermediate layer insertion position |
| 106 | p-AlGaAs intermediate layer | Approximately 10~40nm<br>$0.25\lambda$ or less | |
| 105 | (Al$_{0.3}$Ga)$_{0.5}$InP p-cladding layer<br>$0 <$ Thickness | Approximately 5~10nm | |
| 104 { 104a | (Al$_{0.1}$Ga)$_{0.5}$InP quantum well layer | Approximately 3~6nm | |
| 104 { 104b | (Al$_{0.3}$Ga)$_{0.5}$InP barrier layer | Approximately 5~10nm | |
| 104 { 104a | (Al$_{0.1}$Ga)$_{0.5}$InP quantum well layer | Approximately 3~6nm | |
| 104 { 104b | (Al$_{0.3}$Ga)$_{0.5}$InP barrier layer | Approximately 5~10nm | |
| 104 { 104a | (Al$_{0.1}$Ga)$_{0.5}$InP quantum well layer | Approximately 3~6nm | |
| 103 { 103b | (Al$_{0.3}$Ga)$_{0.5}$InP n-cladding layer | Approximately $0.1 \sim 0.3\lambda$ | |
| 103 { 103a | (Al$_{0.7}$Ga)$_{0.5}$InP n-cladding layer | Approximately $0.1 \sim 0.5\lambda$ | |
| 102 | n-DBR layer<br>n-Al$_{0.9}$GaAs / n-Al$_{0.5}$GaAs | Approximately $40 \sim 60\lambda$ | |
| 101 | GaAs substrate | — | |

FIG.4

VERTICAL CAVITY SURFACE EMITTING LASER ELEMENT AND ELECTRONIC APPARATUS

CROSS REFERENCE TO RELATED APPLICATIONS

This application is a U.S. National Phase of International Patent Application No. PCT/JP2019/006247 filed on Feb. 20, 2019, which claims priority benefit of Japanese Patent Application No. JP 2018-061492 filed in the Japan Patent Office on Mar. 28, 2018. Each of the above-referenced applications is hereby incorporated herein by reference in its entirety.

TECHNICAL FIELD

The present technology relates to a vertical cavity surface emitting laser element that is a semiconductor laser element, and an electronic apparatus.

BACKGROUND ART

AlGaInP lasers having an emission wavelength band ranging from 630 to 690 nm have come to be used in information devices such as optical drives, copiers, laser printers, and bar code readers, a light source for short-distance communication for plastic optical fibers, and recently in projectors, displays, and the like, and have been widely applied. With the spread of such applications, demands for not only the characteristic improvement but also miniaturization, cost reduction, and the like are also increasing.

In order to realize devices that satisfy such requirements, AlGaInP vertical cavity surface emitting laser (VCSEL) devices that have a low threshold value and a micro-volume, do not require cleaving, and can be arrayed are being developed.

In a typical AlGaInP VCSEL element, an active layer is made of an AlGaInP material, which is a red-band light emitting material. This active layer needs to be set so that the optical film thickness in the device matches the wavelength period (i.e., an integer multiple of $\lambda/2$) and the optical field is strong in the active layer portion. Note that in the medium, when the refractive index of the medium is defined as n, the wavelength $\Delta$ is 1/n times the original one.

A distributed bragg reflector (DBR) of p-type and n-type AlAs/$Al_{0.5}Ga_{0.5}As$ (AlAs is an $Al_{0.9}Ga_{0.1}As$ or the like in some cases) is formed on the upper layer and the lower layer of the active layer. Since the reflectance of the DBR needs to be increased to approximately 99.9%, 30 or more pairs of layers are required.

The DBR can also be made of AlGaInP. However, an AlGaAs layer is usually used because it is difficult to apply a refractive index difference or the thermal resistance is lower in the AlGaAs layer.

Next, the AlGaInP material will be described. The AlGaInP material is excellent as a light-emitting material in the 630 to 690 nm band. However, there is an essential issue that $\Delta Ec$ (conduction band offset) cannot be increased even by changing the mixed crystal composition as compared with an AlGaAs/GaAs material or the like (see, for example, Patent Literature 1). In addition, in the mixed crystal material such as AlGaInP, the thermal conductivity is also reduced.

CITATION LIST

Patent Literature

Patent Literature 1: Japanese Patent Application Laid-open No. 2003-17813

DISCLOSURE OF INVENTION

Technical Problem

From the above-mentioned causes, AlGaInP materials have an essential issue that overflow of carriers occurs due to an increase in temperatures and the light emission efficiency is greatly lowered. In particular, in the case where the emission wavelength is set to a short wavelength, the thickness of the GaInP active layer needs to be reduced or the active layer needs to be an AlGaInP layer. Therefore, the $\Delta Ec$ becomes smaller and the output decreases.

Carrier overflow is particularly problematic in VCSEL structures. The reason of this is because the heat dissipation is deteriorated on the device structure because light is emitted in a micro-volume. As a result, a VCSEL element including the active layers made of an AlGaInP material has a problem that the emission intensity is greatly reduced as the emission wavelength is shortened.

In view of the circumstances as described above, it is an object of the present technology to provide a vertical cavity surface emitting laser element and an electronic apparatus that have high light emission efficiency.

Solution to Problem

In order to achieve the above-mentioned object, a vertical cavity surface emitting laser element according to the present technology includes: an active layer; a first cladding layer; and an intermediate layer.

The first cladding layer is provided on the active layer.

The intermediate layer is provided on the first cladding layer, electrons in the intermediate layer having potential higher than potential of electrons in the first cladding layer, holes in the intermediate layer having potential higher than potential of holes in the first cladding layer.

With this configuration, outflow of electrons from the first cladding layer (carrier overflow) is prevented by the intermediate layer having potential of electrons and potential of holes higher than those in the first cladding layer, and more electrons contribute to light emission in the active layer. Therefore, the light emission efficiency is improved.

The first cladding layer may be made of AlGaInP, and the intermediate layer may be made of a material that is different from AlGaInP and has potential of electrons higher than that of AlGaInP and potential of holes higher than that of AlGaInP.

Although AlGaInP is suitable as a material of a VCSEL element in the red wavelength band, overflow of carriers occurs due to an increase in the temperature, resulting in a decrease in light emission efficiency. In addition, even if the mixed crystal composition is changed, the band structure of AlGaInP is less changed, and it is difficult to cause AlGaInP to function as a carrier blocking layer for preventing carrier overflow from occurring. Therefore, an intermediate layer made of a material having potential of electrons and potential of holes higher than those of AlGaInP is caused to function as a carrier blocking layer, whereby the light emission efficiency can be improved.

The intermediate layer may be made of a Group V material different from AlGaInP.

AlGaInP is made of Group III materials (Al, Ga, and In) and a Group V material (P). However, an intermediate layer may be made of a material containing a Group V (N, As, Sb, or Bi) material other than P.

The intermediate layer may be made of p-AlGaAs.

p-AlGaAs (AlGaAs doped with p-type dopant) can be easily doped with a dopant that is less likely to diffuse, such as C. In addition, p-AlGaAs is less likely to cause a decrease in crystal quality due to doping. For this reason, even if the intermediate layer made of p-AlGaAs is disposed in the vicinity of the active layer, it is possible to prevent the light-emitting characteristics from deteriorating due to the migration of dopants.

A p-type dopant of the intermediate layer may be C.

C is a dopant which hardly diffuses, and it becomes possible to prevent d the light-emitting characteristics of the active layer from deteriorating due to diffusion of the dopant.

The p-type dopant may have a carrier concentration of $1 \times 10^{18}$ cm$^{-3}$ or more.

When the carrier concentration of the dopant is increased, the potential of electrons is further improved. In the case where AlGaAs is doped with C, the carrier concentration is set to $1 \times 10^{18}$ cm$^{-3}$ or more, whereby sufficient potential of electrons can be achieved to suppress carrier overflow.

The intermediate layer may be located in a node of an optical field formed in the vertical cavity surface emitting laser element.

When the intermediate layer is located at a position where the optical field is strong, the carrier absorption of light occurs due to the high carrier concentration of the intermediate layer, and the light emission efficiency decreases. However, it is possible to suppress the carrier absorption of light by providing the intermediate layer on the node of the optical field.

A thickness of the intermediate layer may be greater than 0 and 0.25λ or less when an oscillation wavelength of the vertical cavity type surface emitting laser element is defined as λ.

In the case where the intermediate layer is located at a position where the optical field is strong, carrier absorption of light can be suppressed by reducing the thickness of the intermediate layer. Specifically, the thickness of the intermediate layer is favorably greater than 0 and 0.25λ or less.

A cavity length may be 0.5λ or less when an oscillation wavelength of the vertical cavity type surface emitting laser element is defined as λ.

In the case where the cavity length (distance between a pair of DBR layers) is 0.5λ or less, light cannot be efficiently confined in the active layer if the DBR layers are brought close to each other by a certain amount or more. Therefore, the DBR layers cannot be brought close to the active layer. However, in the above-mentioned configuration, it is possible to provide an intermediate layer that functions as a carrier blocking layer at a position close to the active layer, and carrier overflow can be suppressed at a position closer to the active layer.

The oscillation wavelength may be 630 nm or more and 690 nm or more.

In a VCSEL element having an oscillation wavelength of 630 nm or more and 690 nm or less (red wavelength band), AlGaInP is used as materials of the active layer and the cladding layer. However, AlGaInP is a material in which carrier overflow occurs as described above. Therefore, by providing an intermediate layer, it is possible to realize a VCSEL element that emits red light with high light emission efficiency.

The first cladding layer may be a p-type cladding layer.

Electrons, which are p-type carriers, have high mobility as compared with holes, which are n-type carriers, and it is necessary to suppress carrier overflow by using the intermediate layer.

The vertical cavity type surface emitting laser device further may include a constriction layer, in which the intermediate layer may be provided between the first cladding layer and the constriction layer.

The vertical cavity surface emitting laser device may further include a second cladding layer provided between the construction layer and the intermediate layer, the second cladding layer being a p-type cladding layer.

The vertical cavity surface emitting laser device may further include:

an n-type DBR (Distributed Bragg Reflector) layers;

a p-type DBR (Distributed Bragg Reflector) layers; and an n-type cladding layer provided between the n-type DBR layer and the active layer, in which the constriction layer may be provided between the p-type DBR layer and the intermediate layer.

In order to achieve the above-mentioned object, an electronic apparatus according to the present technology includes: a vertical cavity surface emitting laser element.

The vertical cavity surface emitting laser element includes an active layer, a first cladding layer provided on the active layer, and an intermediate layer provided on the first cladding layer, electrons in the intermediate layer having potential higher than potential of electrons in the first cladding layer, holes in the intermediate layer having potential higher than potential of holes in the first cladding layer.

As described above, in accordance with the present technology, it is possible to provide a vertical cavity surface emitting laser element and an electronic apparatus that have high light emission efficiency.

BRIEF DESCRIPTION OF DRAWINGS

FIG. 4 is a table showing a configuration of the respective layers of the VCSEL element.

MODE(S) FOR CARRYING OUT THE INVENTION

[Structure and Operation of Common VCSEL Element]

The structure and operation of a common VCSEL (Vertical Cavity Surface Emitting Laser) element will be described in comparison with a VCSEL element according to this embodiment.

Figure 1:
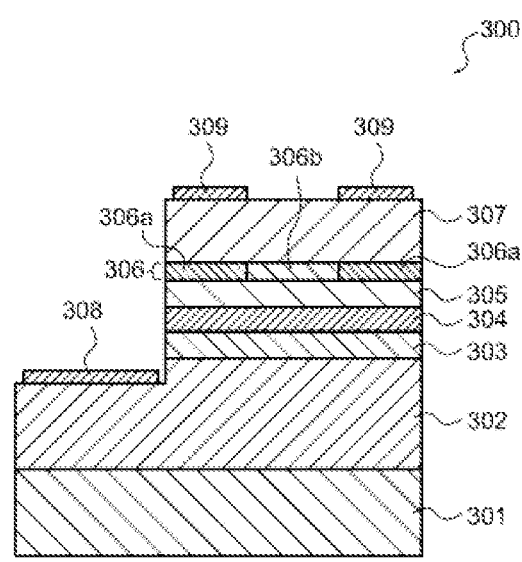
FIG. 1 is a cross-sectional view showing a configuration of a common VCSEL element.

FIG. 1 is a schematic diagram showing the structure of a typical VCSEL element 300. As shown in the figure, the VCSEL element 300 includes a substrate 301, an n-DBR layer 302, an n-cladding layer 303, an active layer 304, a p-cladding layer 305, a constriction layer 306, a p-DBR layer 307, an n-electrode 308, and a p-electrode 309.

The active layer 304 includes a plurality of layers formed by alternately stacking a quantum well layer having a small band gap and a barrier layer having a large band gap to form a quantum well. In the constriction layer 306, an oxidized region 306a and a non-oxidized region 306b are formed.

When a voltage is applied between the n-electrode 308 and the p-electrode 309, a current flows between the n-electrode 308 and the p-electrode 309. The current is subjected to a constricting action by the constriction layer 306 and injected into the non-oxidized region 306b.

Due to this injected current, spontaneous emission light is generated in a region of the active layer 304 close to the non-oxidized region 306b. The spontaneous emission light travels in the stacking direction of the VCSEL element 300 (in the direction perpendicular to the layer), and is reflected by the n-DBR layer 302 and the p-DBR layer 307.

The n-DBR layer 302 and the p-DBR layer 307 are configured to reflect light having a particular wavelength (hereinafter, oscillation wavelength). The component of the spontaneous emission light having the oscillation wavelength forms a standing wave between the n-DBR layer 302 and the p-DBR layer 307, and is amplified by the active layer 304.

When the injected current exceeds a threshold value, the light that forms the standing wave performs laser oscillation, passes through the p-cladding layer 305, the constriction layer 306, and the p-DBR layer 307, and is emitted in the stacking directions of the VCSEL element 300.

[Band Structure of Common VCSEL Element]

Figure 2:
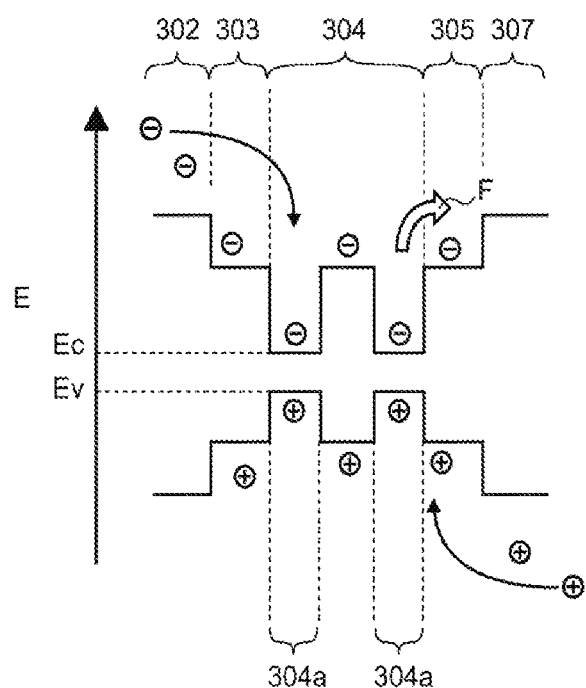
FIG. 2 is a schematic diagram showing a band structure of the VCSEL element.

FIG. 2 is a schematic diagram showing a band-structure of the VCSEL element 300. When a voltage is applied between the n-electrode 308 and the p-electrode 309, electrons (minus in the figure) flow into the active layer 304 from the n-DBR layer 302 side (upper left in the figure). Holes (plus in the figure) flow into the active layer 304 from the p-DBR layer 307 side (lower right in the figure).

The electrons transit from the excited state (Ec) to the ground state (Ev) in the quantum well layer (304a in the figure) of the active layer 304, and generate spontaneous emission light by recombination with holes.

Here, when electrons flow out (carrier overflow, F in the figure) to the p-cladding layer 305 due to an increase in the temperature, electrons that cause recombination decrease, and the light output decreases. The VCSEL element according to the present technology is for suppressing this carrier overflow.

[Structure of VCSEL Element]

Figure 3:
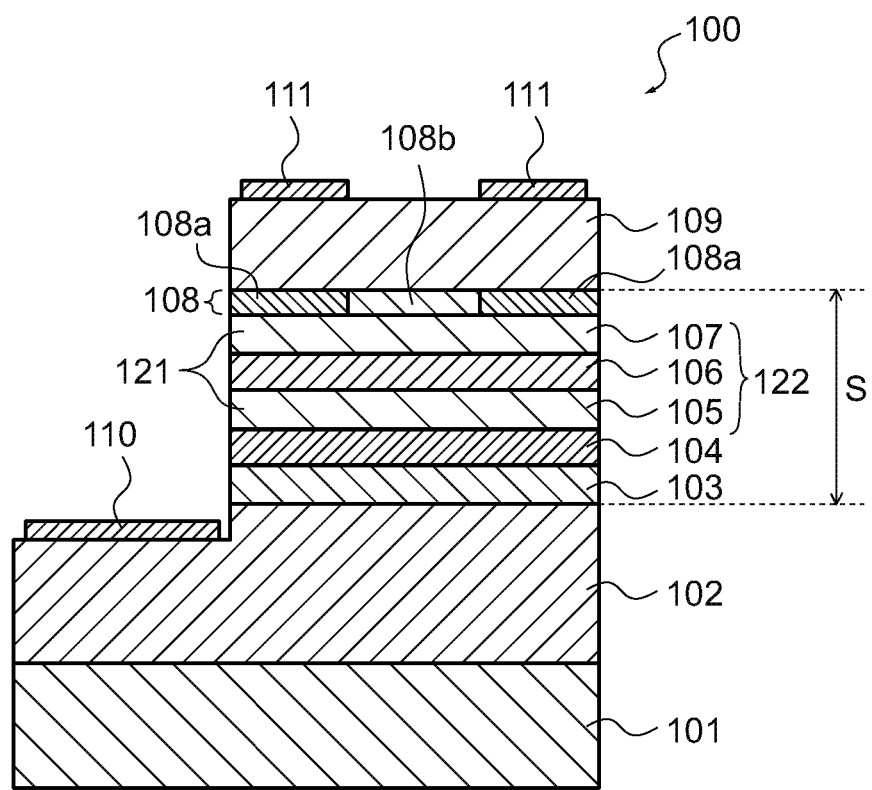
FIG. 3 is a cross-sectional view showing a configuration of a VCSEL element according to an embodiment of the present technology.

The structure of the VCSEL element according to this embodiment will be described. FIG. 3 is a schematic diagram showing a structure of a VCSEL element 100 according to this embodiment. Further, FIG. 4 is a table showing examples of materials and film thicknesses of respective layers of the VCSEL element 100. Note that the oscillation wavelength of the VCSEL element 100 is indicated by A in the following description.

As shown in FIG. 3 and FIG. 4, the VCSEL element 100 includes a substrate 101, an n-DBR layer 102, an n-cladding layer 103, an active layer 104, a first p-cladding layer 105, an intermediate layer 106, a second p-cladding layer 107, a constriction layer 108, a p-DBR layer 109, an n-electrode 110, and a p-electrode 111.

Note that the first p-cladding layer 105 and the second p-cladding layer 107 will be collectively referred to as the p-cladding layer 121, and the first p-cladding layer 105, the intermediate layer 106, and the second p-cladding layer 107 will be collectively referred to as the p-cladding/intermediate layer 122.

The substrate 101 supports the respective layers of the VCSEL elements 100. The substrate 101 can be, for example, an n-GaAs substrate, but may be made of other materials.

The n-DBR layer 102 is provided on the substrate 101, and functions as a DBR (Distributed Bragg Reflector) that reflects light having the wavelength λ. The n-DBR layer 102 together with the p-DBR layer 109 constitute a cavity for laser oscillation.

The n-DBR layer 102 may include a plurality of layers formed by alternately stacking a first layer and a second layer. The first layer is a layer made of, for example, n-$Al_{0.9}Ga_{0.1}As$, and the second layer is a layer made of, for example, n-$Al_{0.5}Ga_{0.5}As$. These materials provide a high refractive index difference in lattice-matched systems. The film thickness (the number of layers) of the n-DBR layer 102 is favorably the number of pairs corresponding to approximately 40 to 60λ.

The n-cladding layer 103 is a layer that is stacked on the n-DBR layer 102 and confines light and current in the active layer 104. The n-cladding layer 103 may be formed by stacking a first layer 103a and a second layer 103b, for example.

The first layer 103a is made of, for example, $(Al_{0.7}Ga_{0.3})_{0.5}In_{0.5}P$, and the second layer 103b is made of, for example, $(Al_{0.3}Ga_{0.7})_{0.5}In_{0.5}P$. The first layer 103a and the second layer 103b may be undoped or n-type doped.

The thickness of the first layer 103a is, for example, approximately 0.1 to 0.5λ, and the thickness of the second layer 103b is, for example, approximately 0.1 to 0.3λ. Since As materials cannot emit light in the 630 to 690 nm band, AlGaInP, which is a P material, needs to be used, and the material of As/P is changed in the n-cladding 103.

Further, the n-cladding layer 103 may include one layer or three or more stacked layers.

The active layer 104 is provided on the n-cladding layer 103, and emits and amplifies spontaneous emission light. The active layer 104 can include a plurality of layers formed by alternately stacking a quantum well layer 104a and a barrier layer 104b.

The quantum well layer 104a may be made of, for example, $(Al_{0.1}Ga_{0.9})_{0.5}In_{0.5}P$, and the barrier layers 104b may be made of, for example, $(Al_{0.3}Ga_{0.7})_{0.5}In_{0.5}P$. The number of stacked layers of the quantum well layer 104a and the barrier layer 104b is not particularly limited. The thickness of the quantum well layer 104a is, for example, approximately 3 to 6 nm, and the thickness of the barrier layer 104b is, for example, approximately 5 to 10 nm.

The first p-cladding layer 105 is a layer that is provided on the active layer 104 and confines light and current in the active layer 104. The first p-cladding layer 105 is made of, for example, ($Al_{0.3}Ga_{0.7-0.5}In_{0.5}P$), and has a thickness of, for example, approximately 5 nm to 10 nm.

The material of the first p-cladding layer 105 may be undoped or p-type doped. Further, the first p-cladding layer 105 may be a layer in which a plurality of layers are stacked.

The intermediate layer 106 is provided on the first p-cladding layer 105. The function of the intermediate layer 106 will be described later. The intermediate layer 106 may be made of, for example, p-AlGaAs. The thickness of the intermediate layer 106 is, for example, approximately 10 to 40 nm, and is favorably 0.25λ or less.

The second p-cladding layer 107 is a layer that is provided on the intermediate layer 106 and confines light and current in the active layer 104. The second p-cladding layer 107 may be, for example, one obtained by stacking a first layer 107a and a second layer 107b.

The first layer 107a may be made of, for example, ($Al_{0.3}Ga_{0.7-0.5}In_{0.5}P$). The thickness of the first layer 107a is, for example, approximately 0.1 to 0.3λ.

The second layer 107b may be made of, for example, $(Al_{0.7}Ga_{0.3})_{0.5}In_{0.5}P$. The thickness of the second layer 107b is, for example, approximately 0.1 to 0.5λ.

The materials of the first layer 107a and the second layer 107b may be undoped or p-type doped. Further, the second p-cladding layer 107 is not limited to a layer in which two layers are stacked, and may be a layer in which one layer or three or more layers are stacked.

The constriction layer 108 is provided on the second p-cladding layer 107 and imparts a constricting action to the current. The constriction layer 108 includes an oxidized region 108a and a non-oxidized region 108b. The oxidized region 108a is made of, for example, oxidized AlAs or the like, has low conductivity and low refractive index, and functions as a light-confining region.

The non-oxidized region 108b is made of, for example, unoxidized AlAs or the like, has conductivity higher than that of the oxidized region 108a, and functions as a current injection region. The thickness of the constriction layer 108 is, for example, approximately 10 to 40 nm.

The p-DBR layer 109 is provided on the constriction layer 108 and functions as a DBR that reflects light having the wavelength λ. The p-DBR layer 109 together with the n-DBR layer 102 constitute a cavity for laser oscillation.

The p-DBR layer 109 may include a plurality of layers formed by alternately stacking a first layer and a second layer. The first layer is a layer made of, for example, p-$Al_{0.9}Ga_{0.1}As$, and the second layer is a layer made of, for example, p-$Al_{0.5}Ga_{0.5}As$. These materials provide a high refractive index difference in lattice-matched systems. The film thickness (the number of layers) of the p-DBR layer 109 is favorably the number of pairs corresponding to approximately 25 to 35λ.

Note that the layers between the n-DBR layer 102 and the p-DBR layer 109 are called a cavity. A cavity S is shown in FIG. 3.

An n-electrode 110 is formed on the n-DBR layer 102 and functions as one electrode of the VCSEL element 100. The n-electrode 110 is made of an arbitrary conductive material.

The p-electrode 111 is formed on the p-DBR layer 109 and functions as the other electrode of the VCSEL element 100. The p-electrode 111 is made of an arbitrary conductive material.

The VCSEL element 100 has the configuration described above. Note that an insulation layer 112 (see FIG. 4), which is not shown in FIG. 3, is provided in the VCSEL element 100. The insulation layer 112 covers the surface of the VCSEL element 100 except on the n-electrode 110 and on the p-electrode 111.

The insulation layer 112 includes, for example, a first layer 112a made of $SiO_2$ having a thickness of 0.25λ and a second layer 112b made of SiN having a thickness of 0.25λ.

The material and film thickness of the above-mentioned VCSEL element 100 are not limited to those described above as long as a band structure described below can be realized. For example, the second p-cladding layer 107 does not necessarily need to be provided, and the VCSEL element 100 may include only the first p-cladding layer 105 as the p-cladding layer 121.

[Operation of VCSEL Element]

When a voltage is applied between the n-electrode 110 and the p-electrode 111, a current flows between the n-electrode 110 and the p-electrode 111. The current is subjected to a constricting action by the constriction layer 108 and injected into the non-oxidized region 108b.

The injected current generates spontaneous emission light in a region of the active layer 104 adjacent to the non-oxidized region 108b. The spontaneous emission light travels in the stacking direction of the VCSEL element 100 (in the direction perpendicular to the layer), and is reflected by the n-DBR layer 102 and the p-DBR layer 109.

The n-DBR layer 102 and the p-DBR layer 109 are configured to reflect light having the oscillation wavelength λ. The component of the spontaneous emission light having the oscillation wavelength λ forms a standing wave between the n-DBR layer 102 and the p-DBR layer 109, and is amplified by the active layer 104.

When the injected current exceeds the threshold value, the light that forms the standing wave performs laser oscillation, and is transmitted through the first p-cladding layer 105, the intermediate layer 106, the second p-cladding layer 107, the constriction layer 108, and the p-DBR layer 109 and emitted.

Here, in the VCSEL element 100, carrier overflow (see FIG. 2) is suppressed by the intermediate layer 106, thereby improving the light emission efficiency.

[Configuration of Intermediate Layer]

The intermediate layer 106 is a layer in which the potential of electrons is higher than the potential of electrons in the p-cladding layer 121 (the first p-cladding layer 105 and the second p-cladding layer 107) and the potential of holes is higher than the potential of holes in the p-cladding layer 121.

Figure 5:
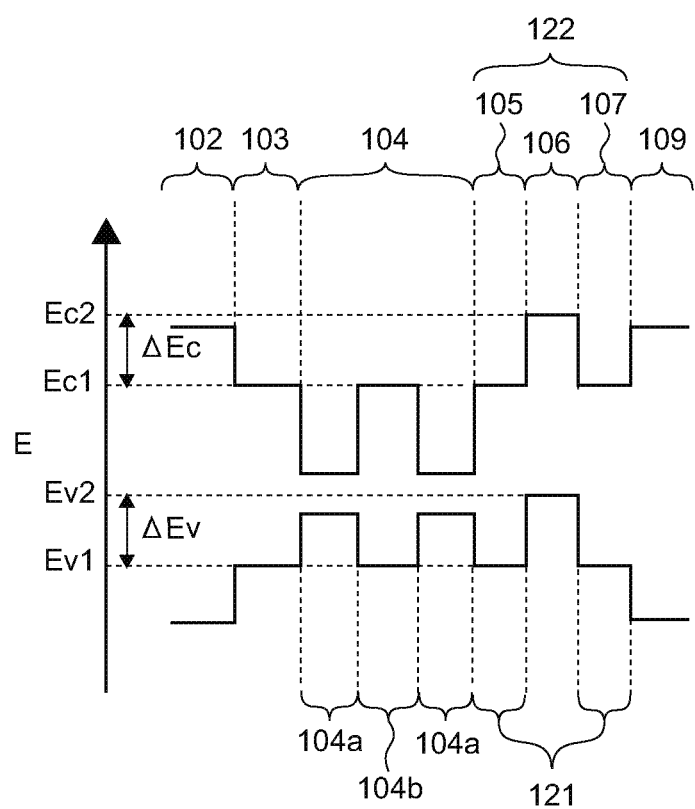
FIG. 5 is a schematic diagram showing a band structure of the VCSEL element.

FIG. 5 is a schematic diagram showing a band structure of the VCSEL element 100. As shown in the figure, potential Ec2 of the electrons in the intermediate layer 106 is higher than potential Ec1 of the electrons in the p-cladding layer 121. In other words, ΔEc, which represents the difference between the potential Ec2 of the electrons in the intermediate layer 106 and the potential Ec1 of the electrons in the p-cladding layer 121, has a positive value.

Further, as shown in the figure, the potential Ev2 of electrons in the intermediate layer 106 is higher than the potential Ev1 of holes in the p-cladding layer 121. In other words, ΔEv, which is the difference between the potential Ev2 of holes in the intermediate layer 106 and the potential Ev1 of holes in the p-cladding layer 121, has a positive value.

Note that in the case where the potential of electrons and holes differ between the first p-cladding layer 105 and second p-cladding layer 107, the potential of electrons in the intermediate layer 106 only needs to be higher than the potential of electrons in the first p-cladding layer 105 and the potential of holes in the intermediate layer 106 only needs to be higher than the potential of holes in the first p-cladding layer 105.

Further, also in the case where the second p-cladding layer 107 is not provided, the potential 1 of electrons in the intermediate layer 106 only needs to be higher than the potential of electrons in the first p-cladding layer 105 and the potential of holes in the intermediate layer 106 only needs to be higher than the potential of holes in the first p-cladding layer 105.

[Regarding Functions of Intermediate Layer]

Figure 6:
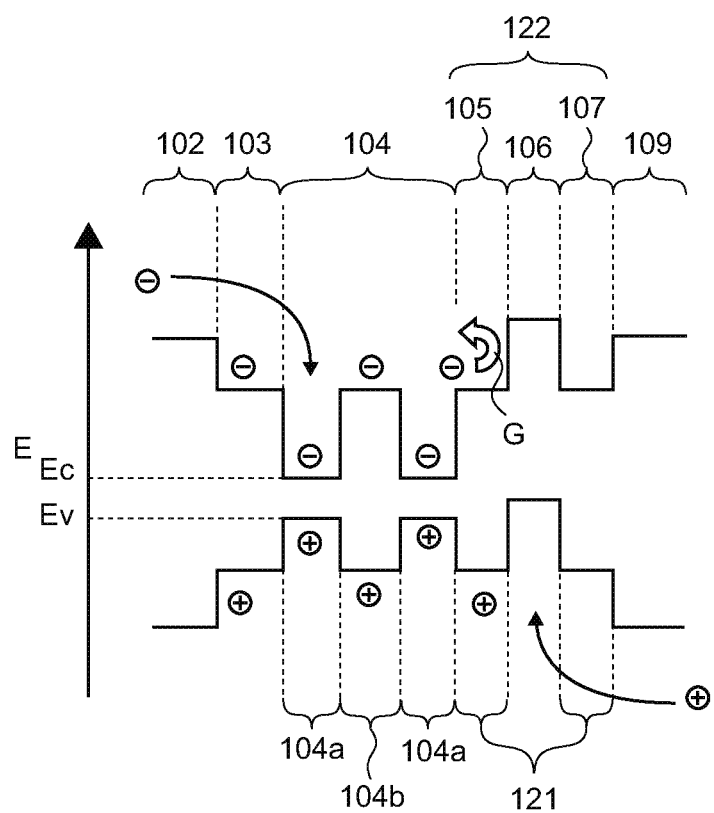
FIG. 6 is a schematic diagram showing a band structure and carrier migration of the VCSEL element.

FIG. 6 is a schematic diagram of a band structure showing the function of the intermediate layer 106. When a voltage is applied between the n-electrode 110 and the p-electrode 111, electrons (minus in the figure) flow into the active layer 104 from the n-DBR layer 102 side (upper left in the figure). Holes (plus in the figure) flow into the active layer 104 from the p-DBR layer 109 side (lower right in the figure).

The electrons transit from the excited state (Ec) to the ground state (Ev) in the quantum well layer 104a of the active layer 104, and generate spontaneous emission light by recombination with holes.

The electrons are prevented from flowing out of the first p-cladding layer 105 by the intermediate layer 106 having electron potential higher than that in the p-cladding layer 121 (arrow G in the figure), recombination occurs in the active layer 104. That is, the intermediate layer 106 makes it possible to suppress the outflow of electrons (carrier overflow) and improve the light emission efficiency. Note that holes have mobility less than that of electrons, and thus, carrier overflow is not a problem.

[Regarding material of intermediate layer]

The material of the intermediate layer 106 will be described. As described above, the intermediate layer 106 only needs to be made of a material capable of forming a layer having potential of electrons higher than that in the p-cladding layer 121 and potential of holes higher than that in the p-cladding layer 121.

Specifically, p-AlGaAs (p-type doped AlGaAs) is suitable as the material of the intermediate layer 106, and C is suitable as the p-type dopant.

In the VCSEL element having a wavelength band of 630 nm or more and 690 nm or less as the emission wavelength band, an AlGaInP material is mainly used as the material of the active layer and the cladding layer. The AlGaInP material is excellent as a light-emitting material, but ΔEc cannot be increased even if the mixed crystal composition is changed and a carrier blocking layer (a layer that suppresses carrier overflow) cannot be formed.

For this reason, improving ΔEc by p-type doping is conceivable. However, Mg, which is a p-type dopant of the AlGaInP material, is a material that has a memory effect and is easy to diffuse. For this reason, when the doping concentration of Mg is increased in the vicinity of the active layer, Mg diffuses into the active layer and the light-emitting characteristics are deteriorated.

Further, as the p-type dopant of the AlGaInP material, it is also conceivable to use C that hardly diffuses. However, since AlGaInP is made of materials having significantly different bonding strengths, i.e., Al and In, a decrease in crystal quality, compositional deviation, and the like due to C-doping occur.

Here, AlGaAs is a material that does not cause crystal quality deterioration due to C-doping. Therefore, by inserting the intermediate layer 106 made of p-AlGaAs doped with C into the p-cladding layer 121, it is possible to suppress carrier overflow by increasing ΔEc (see FIG. 6) and to suppress deterioration of the light-emitting characteristics due to dopant migration.

The C-doping to AlGaAs can be easily performed by auto-doping (doping simultaneous with deposition) or doping using $CBr_4$ as a doping gas.

As described above, p-AlGaAs is suitable as the material of the intermediate layer 106, and C is suitable as the p-type dopant. Note that in the case where the first p-cladding layer 105 is made of $-Al_{0.3}Ga_{0.7-0.5}In_{0.5}P$, the Al composition in AlGaAs is favorably 0.3 or more in order to achieve the band structure shown in FIG. 5.

Further, the p-type dopant of AlGaAs is not limited to C as long as it does not diffuse into the active layer 104 and AlGaAs can be p-type doped.

Further, the material of the intermediate layer 106 is not limited to p-AlGaAs, and only needs to be a material that is different from AlGaInP and has potential of electrons higher than that of AlGaInP and potential of holes higher than that of AlGaInP.

For example, as the material of the intermediate layer 106, also a material containing a Group V (Group 15) material different from AlGaInP can be used. That is, Al, Ga, and In are Group III materials, and P is a Group V material, so that a material containing a Group V element (N, As, Sb, or Bi) other than P can be used.

Examples of such a material include AlGaInAsN, AlGaInAsP, AlGaInAsSb, AlGaInAsBi, AlGaAsN, AlGaPAs, AlGaAsSb, and AlGaAsBi.

[Regarding Carrier Concentration of Intermediate Layer]

The potential of the intermediate layer 106 varies with the carrier concentration (doping concentration) of the p-type dopant in the intermediate layer 106.

Figure 7:
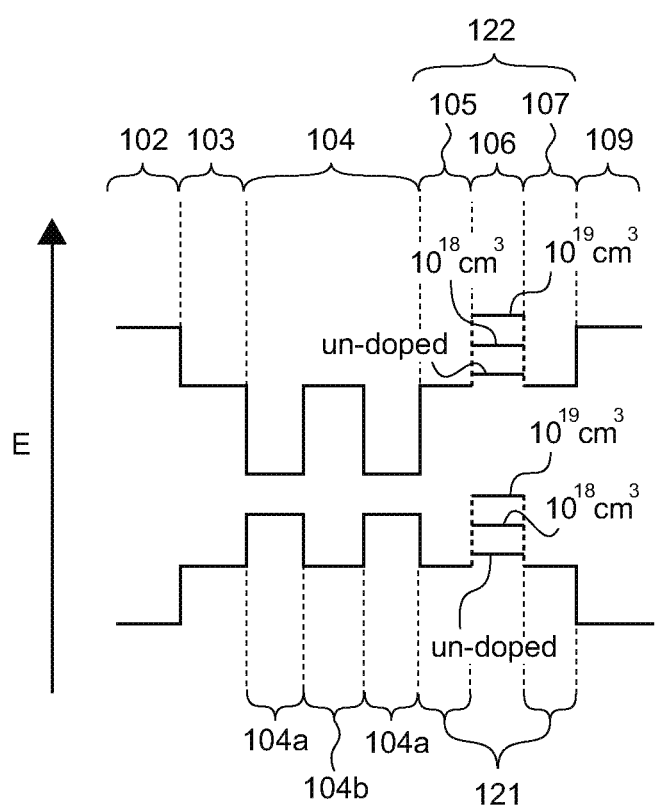
FIG. 7 is a schematic diagram showing a change in the band structure due to the carrier concentration of the VCSEL element.

FIG. 7 is a schematic diagram of a band structure showing changes in carrier concentration and potential of a p-type dopant. As shown in the figure, when the carrier concentration of the dopant increases, the potential of electrons and holes in the intermediate layer 106 increases.

For example, in the case where the intermediate layer 106 is made of $p-Al_{0.9}Ga_{0.1}As$ and the dopant is C, the carrier concentration is favorably $1 \times 10^{18}$ $cm^{-3}$ or more in order to suppress carrier overflow.

[Position of Intermediate Layer]

The intermediate layer 106 is provided between the first p-cladding layer 105 and the second p-cladding layer 107 as described above. Further, the second p-cladding layer 107 does not necessarily need to be provided. In this case, the intermediate layer 106 is provided between the first p-cladding layer 105 and the constriction layer 108.

Here, in order to obtain an effect of suppressing carrier overflow by the intermediate layer 106, it is desirable to provide the intermediate layer 106 as close as possible to the active layer 104.

Meanwhile, when the intermediate layer 106 overlaps with the optical field, carrier absorption occurs due to the high carrier concentration of the intermediate layer 106, and loss increases. Since a VCSEL element can be designed so that a part where the optical field is weak (node of the optical field) is in the cladding, it is favorable to design so that the intermediate layer 106 is located in the vicinity of the active layer 104 and at the node of the optical field.

Figure 8A:
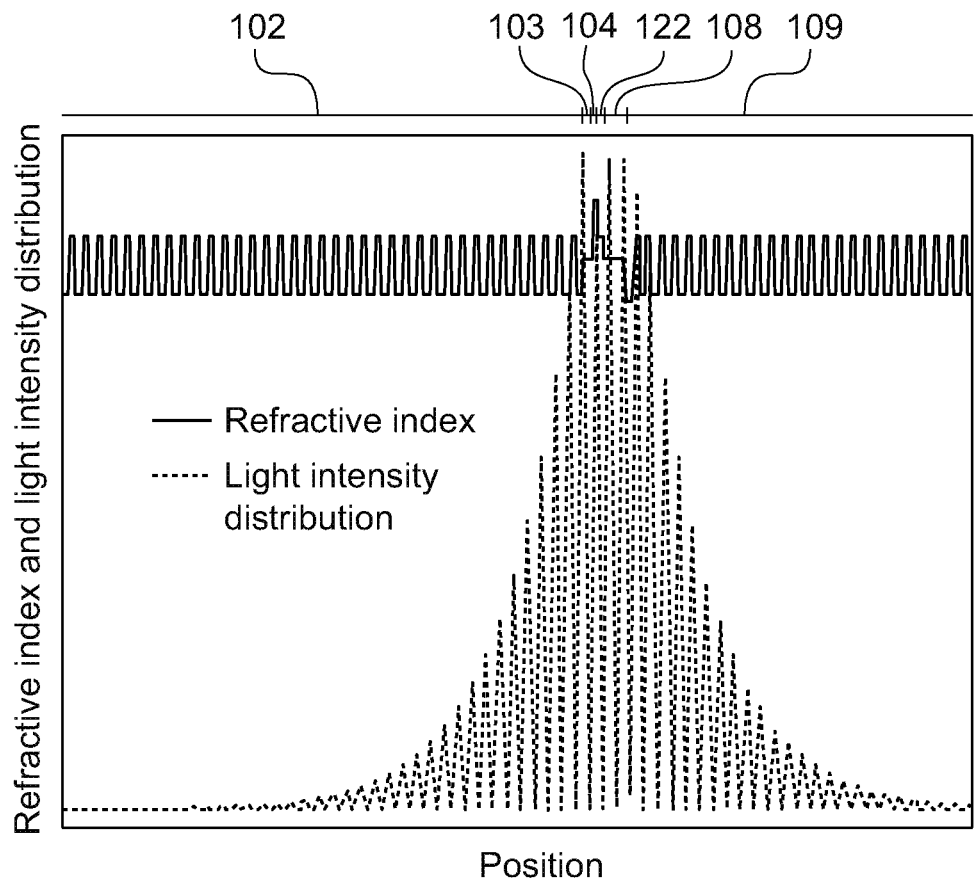
FIGS. 8A and 8B are graphs showing the refractive index and the light intensity distribution of the VCSEL element.
Figure 8B:
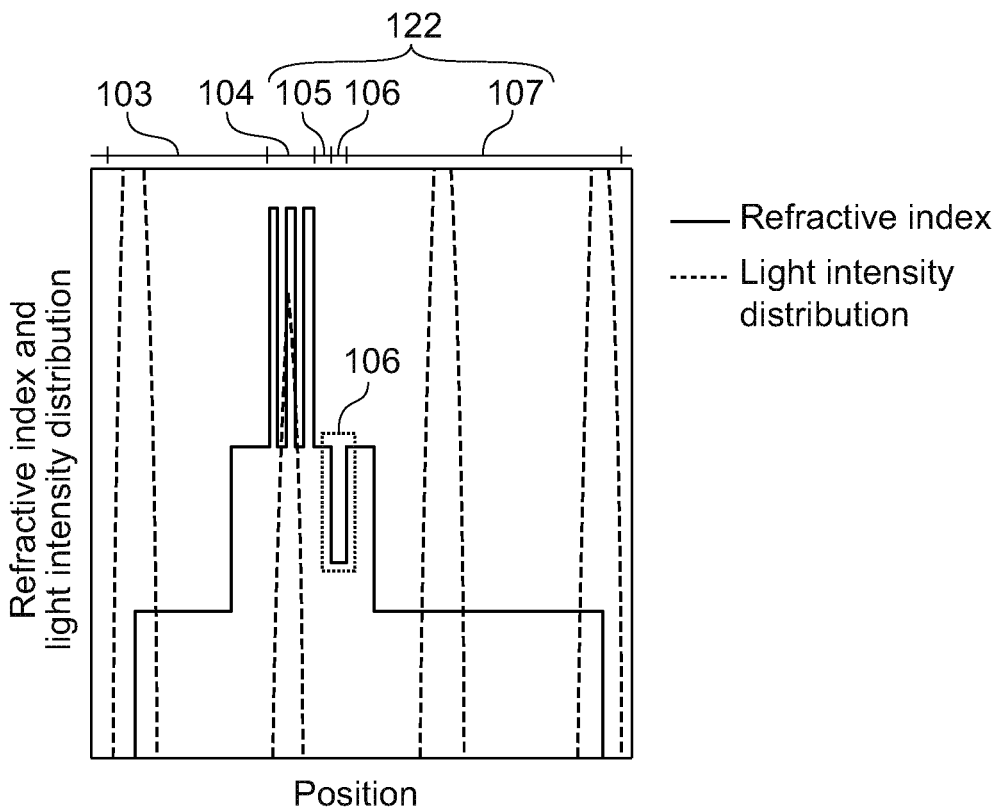

FIGS. 8A and 8B are graphs showing the refractive index and the light intensity distribution in the VCSEL element 100. FIG. 8A is an entire graph of the VCSEL element 100, and FIG. 8B is an enlarged graph of the vicinity of the active layer 104. As shown in the figure, there is a node of the optical field between the anti-nodes of the optical field (extreme values of the graph), and carrier absorption by the intermediate layer 106 can be suppressed by providing the intermediate layer 106 at this node of the optical field.

Note that FIGS. 8A and 8B show the structure in the case where the length (hereinafter, cavity length) of the cavity S (see FIG. 3) is 1.5λ. In this case, since the film thickness of the p-cladding layer is thicker, usually, the output decrease due to carrier overflow is likely to occur. However, by providing the intermediate layer 106, carrier overflow can be suppressed.

Features of Present Technology

Examples of the features of the present technology include the following.
1) An intermediate layer that functions as a carrier blocking layer is formed of a material (e.g., p-AlGaAs) different from the material (e.g., AlGaInP) of the active layer and the cladding layer.
2) An intermediate layer that functions as a carrier blocking layer is formed in the vicinity of the active layer by doping the active layer with an impurity (e.g., C), which hardly diffuses.
3) An intermediate layer doped with an impurity is disposed at a node of the optical field of the VCSEL element to suppress carrier absorption.
4) The thickness of the intermediate layer is reduced to approximately 10 to 20 nm.

Note that among the above-mentioned features, 3) and 4) can be adjusted by the structure of the VCSEL element 100.

Figure 9:
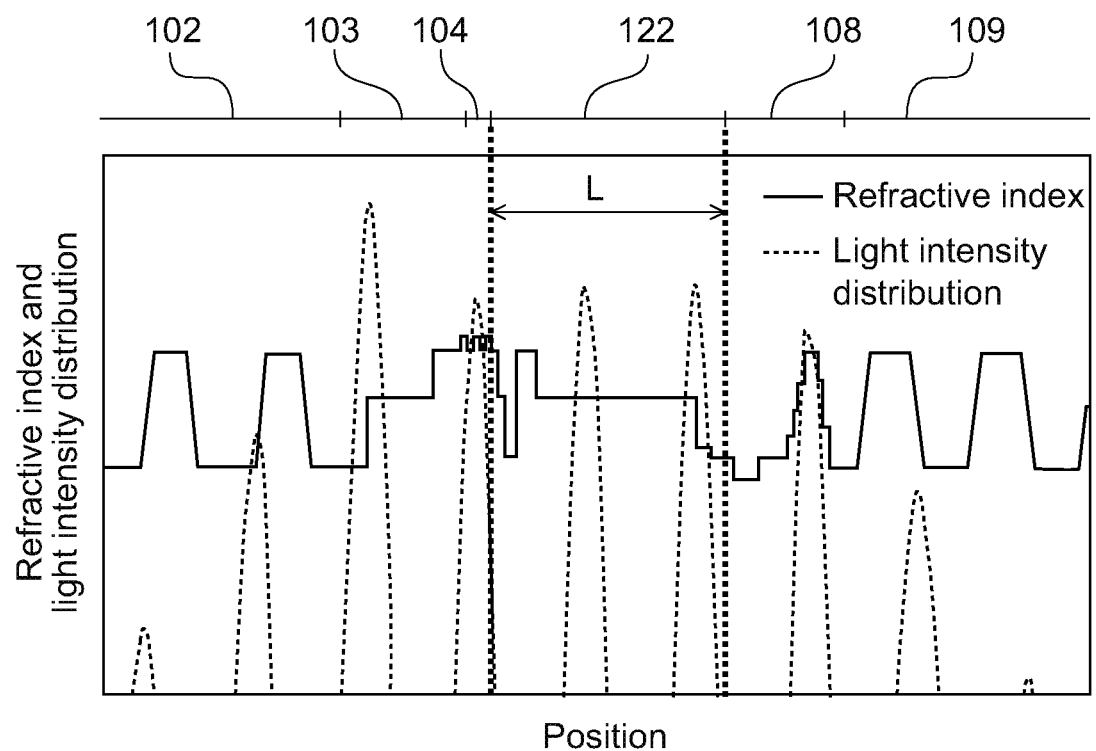
FIG. 9 is a graph showing the refractive index and the light intensity distribution of the VCSEL element and the formation range of the intermediate layer.

For example, the intermediate layer 106 does not necessarily need to be provided at the node of the optical field. FIG. 9 is a schematic diagram showing the insertion position of the intermediate layer 106, which is a graph showing the refractive index and the light intensity distribution in the VCSEL element 100. As shown in the figure, the intermediate layer 106 can be provided between the active layer 104 and the constriction layer 108 (L in the figure).

In the case where the intermediate layer 106 is disposed at a position where the optical field is strong, carrier absorption can be suppressed by reducing the thickness of the intermediate layer 106. Specifically, the thickness of the intermediate layer 106 is favorably greater than 0 and 0.25λ or less.

Figure 10:
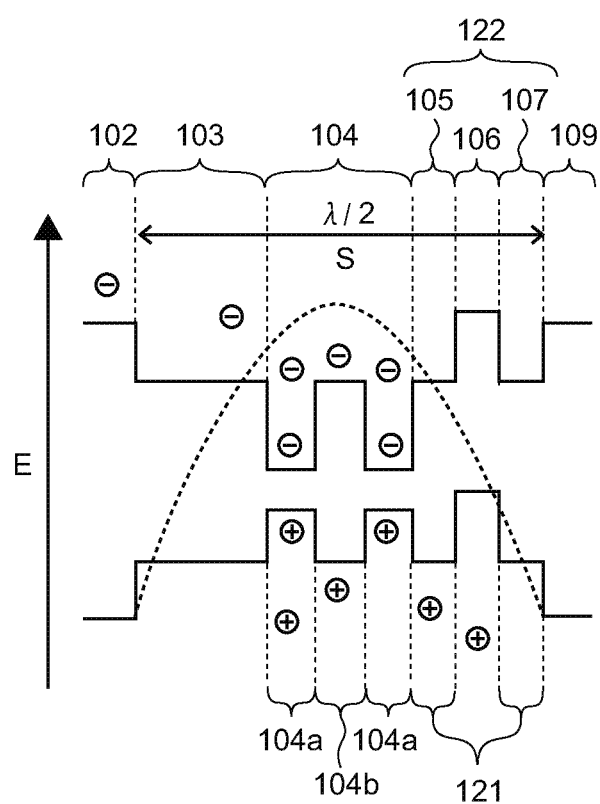
FIG. 10 is a schematic diagram showing a band structure of the VCSEL element in the case where the cavity length is λ/2.

Further, the present technology is applicable also to a structure having a cavity length of 0.5λ or less, in which there is no node of the optical field in the cavity. FIG. 10 is a schematic diagram showing the band structure and the light intensity distribution of the VCSEL element 100 having the cavity length of 0.5λ (λ/2), in which the light intensity distribution is shown by a broken line. As shown in the figure, there is no node of the optical field in the cavity S.

In general, in the case where the cavity length is 0.5λ or less, light cannot be efficiently confined in the active layer when the p-DBR layer is brought close to the active layer by a certain amount or more. For this reason, the p-DBR layer that functions as a carrier blocking layer cannot be brought close to the active layer.

For example, in the case where the cavity length is 0.5λ, the cavity length becomes approximately 100 nm and the p-cladding layer has a thickness of approximately 40 nm when the oscillation wavelength of the VCSEL element is 650 nm. In this case, the carrier blocking layer (p-DBR layer) cannot be brought close to the active layer by 40 nm or more.

However, in the present technology, it is possible to provide the intermediate layer 106 that functions as a carrier blocking layer at a position close to the active layer 104, suppress the carrier overflow at a position closer to the active layer 104, and effectively perform high output.

The thinner the intermediate layer 106, the smaller the carrier absorption. For this reason, even in the case where there is no node of the optical field in the cavity S, it is possible to suppress a decrease in output due to carrier absorption by thinning the intermediate layer 106. The intermediate layer 106 according to the present technology functions effectively even if it has a thickness of approximately 10 nm.

Further, by doping C which does not diffuse in the intermediate layer 106 as described above, it is possible to prevent an impurity from diffusing into the active layer 104 even when the intermediate layer 106 is brought close to the active layer 104.

Effects of Present Technology

The effects of the present technology will be described below.

In the present technology, by suppressing the carrier overflow, it is possible to improve the output characteristics and suppress the output decrease at the time of temperature rise. In general, since a VCSEL element has a small volume and a small heat dissipation property, carrier overflow due to the temperature rise is likely to occur, but this can be effectively suppressed.

Further, in the present technology, it is possible to suppress diffusion of dopants in the intermediate layer and compositional deviation and decrease in crystal quality of the active layer and the cladding layer. It is difficult to dope AlGaInP, which is a common material of the active layer and the cladding layer, with a dopant (e.g., C) that hardly diffuses.

In the present technology, by using a material (e.g., AlGaAs) different from AlGaInP as the intermediate layer, it is possible to dope a dopant such as C and prevent the dopant from diffusing in the intermediate layer.

Further, Zn or Mg is usually used as the p-type dopant of AlGaInP but reduces the light emission efficiency when being introduced into the active layer by diffusion or memory effect. By using the material doped with C in AlGaAs as an intermediate layer, it is possible to suppress a decrease in the light emission efficiency even if the intermediate layer is disposed in the vicinity of the active layer because C hardly diffuses and hardly causes a memory effect.

In addition, increasing the doping concentration in AlGaAs causes the band to shift toward higher levels in the band structure, thereby giving a block effect against electrons. When the carrier concentration exceeds $10^{18}$ cm$^3$, it is possible to effectively block electrons. By increasing the carrier concentration, it is possible to balance and optimize the reliability and carrier absorption.

Further, in the VCSEL element, it is possible to design so that the node of the optical field is located in the cavity. By disposing an intermediate layer having a high carrier concentration in the node part, it is possible to suppress the carrier absorption of light.

Further, even in the case where the intermediate layer cannot be disposed in the node of the optical field, by reducing the thickness of the intermediate layer to approximately 10 nm, it is possible to obtain an effect of suppressing the carrier overflow although the effect is small compared to the case where the intermediate layer is disposed at the node of the optical field.

Further, in the case of using AlGaAs for an intermediate layer, the thermal conductivity of AlGaAs is higher than that of AlGaInP. Therefore, it is possible to improve the thermal resistance in the vicinity of the active layer. This is particularly effective in the case where the intermediate layer is thickened.

Note that carrier overflow can be suppressed by bringing the constriction layer 306 close to the active layer 304 in the structure (see FIG. 1) of a typical VCSEL element. However, generally, the constriction 306 is made of AlAs and the oxidized region 306a become $AlO_x$ by oxidization.

Thus, since the lattice constant is greatly changed, large distortion occurs in the epitaxial layer during production, and the reliability of the VCSEL element is reduced when the constriction layer 306 is brought close to the active layer 304.

Meanwhile, in the VCSEL element 100, the intermediate layer 106 is introduced separately from the constriction layer 108 to suppress carrier overflow. It is possible to reduce the threshold value by the current constriction by the constriction layer 108 as well as achieve high output by suppressing the carrier overflow.

That is, in the VCSEL element 100, it is possible to suppress the output decrease due to the carrier overflow while suppressing a decrease in crystal quality resulting in a decrease in reliability.

Regarding Application

The VCSEL element 100 according to the present technology is a VCSEL element mainly having a red wavelength band of 600 nm to 700 nm as an emission wavelength band, and can be used in various electronic apparatuses such as a light source for a high-speed data link, a display device such as a display and a projector, a laser printer light source, and an optical memory.

It should be noted that the present technology may take the following configurations.

(1)

A vertical cavity surface emitting laser element, including:
an active layer;
a first cladding layer provided on the active layer; and
an intermediate layer provided on the first cladding layer, electrons in the intermediate layer having potential higher than potential of electrons in the first cladding layer, holes in the intermediate layer having potential higher than potential of holes in the first cladding layer.

(2)

The vertical cavity surface emitting laser element according to (1) above, in which
the first cladding layer is made of AlGaInP, and
the intermediate layer is made of a material that is different from AlGaInP and has potential of electrons higher than that of AlGaInP and potential of holes higher than that of AlGaInP.

(3)

The vertical cavity surface emitting laser element according to (2) above, in which
the intermediate layer is made of a Group V material different from AlGaInP.

(4)

The vertical cavity surface emitting laser element according to (3) above, in which
the intermediate layer is made of p-AlGaAs.

(5)

The vertical cavity surface emitting laser element according to (4) above, in which
a p-type dopant of the intermediate layer is C.

(6)

The vertical cavity surface emitting laser element according to (5) above, in which the p-type dopant has a carrier concentration of $1\times10^{18}$ $cm^{-3}$ or more.

(7)

The vertical cavity surface emitting laser element according to any one of (1) to (6) above, in which
the intermediate layer is located in a node of an optical field formed in the vertical cavity surface emitting laser element.

(8)

The vertical cavity surface emitting laser element according to any one of (1) to (7) above, in which
a thickness of the intermediate layer is greater than 0 and $0.25\lambda$ or less when an oscillation wavelength of the vertical cavity type surface emitting laser element is defined as $\lambda$.

(9)

The vertical cavity surface emitting laser element according to any one of (1) to (8) above, in which
a cavity length is $0.5\lambda$ or less when an oscillation wavelength of the vertical cavity type surface emitting laser element is defined as $\lambda$.

(10)

The vertical cavity surface emitting laser element according to any one of (1) to (9) above, in which
an oscillation wavelength is 630 nm or more and 690 nm or less.

(11)

The vertical cavity surface emitting laser element according to any one of (1) to (10) above, in which
the first cladding layer is a p-type cladding layer.

(12)

The vertical cavity type surface emitting laser according to (11) above, further including
a constriction layer, in which
the intermediate layer is provided between the first cladding layer and the constriction layer.

(13)

The vertical cavity type surface emitting laser device according to (12) above, further including
a second cladding layer provided between the construction layer and the intermediate layer, the second cladding layer being a p-type cladding layer.

(14)

The vertical cavity type surface emitting laser device according to claim 12) or (14) above, further including:
an n-type DBR (Distributed Bragg Reflector) layer;
a p-type DBR (Distributed Bragg Reflector) layer; and
an n-type cladding layer provided between the n-type DBR layer and the active layer, in which
the constriction layer is provided between the p-type DBR layer and the intermediate layer.

(15)

An electronic apparatus, including:
a vertical cavity surface emitting laser element, including
an active layer,
a first cladding layer provided on the active layer, and
an intermediate layer provided on the first cladding layer, electrons in the intermediate layer having potential higher than potential of electrons in the first cladding layer, holes in the intermediate layer having potential higher than potential of holes in the first cladding layer.

REFERENCE SIGNS LIST

100 VCSEL element
101 substrate
102 n-DBR layer
103 n-cladding layer
104 active layer
105 first p-cladding layer
106 intermediate layer
107 second p-cladding layer
108 constriction layer
109 p-DBR layer
110 n-electrode
111 p-electrode

The invention claimed is:

1. A vertical cavity surface emitting laser element, comprising:
an active layer;
a first cladding layer on the active layer, wherein
the first cladding layer is in direct contact with the active layer, and
a material of the first cladding layer includes AlGaInP; and
an intermediate layer on the first cladding layer, wherein
the intermediate layer is in direct contact with the first cladding layer,
a material of the intermediate layer is different from the material of the first cladding layer,
the material of the intermediate layer has potential of electrons higher than that of AlGaInP, and
the material of the intermediate layer has potential of holes higher than that of AlGaInP.

2. The vertical cavity surface emitting laser element according to claim 1, wherein
the material of the intermediate layer includes at least one Group V element.

3. The vertical cavity surface emitting laser element according to claim 2, wherein the material of the intermediate layer includes p AlGaAs.

4. The vertical cavity surface emitting laser element according to claim 3, wherein a p-type dopant of the intermediate layer is C.

5. The vertical cavity surface emitting laser element according to claim 4, wherein the p-type dopant has a carrier concentration of $1\times10^{18}$ cm$^{-3}$ or more.

6. The vertical cavity surface emitting laser element according to claim 1, wherein the intermediate layer is in a node of an optical field of the vertical cavity surface emitting laser element.

7. The vertical cavity surface emitting laser element according to claim 1, wherein
a thickness of the intermediate layer is greater than 0 and 0.25λ or less in a case where an oscillation wavelength of the vertical cavity surface emitting laser element is λ, and
the oscillation wavelength is a specific wavelength with which light reflects from the vertical cavity surface emitting laser element.

8. The vertical cavity surface emitting laser element according to claim 1, wherein
a cavity length is greater than 0 and 0.5λ or less in a case where an oscillation wavelength of the vertical cavity surface emitting laser element is λ, and
the oscillation wavelength is a specific wavelength with which light reflects from the vertical cavity surface emitting laser element.

9. The vertical cavity surface emitting laser element according to claim 1, wherein an oscillation wavelength of the vertical cavity surface emitting laser element is 630 nm or more and 690 nm or less.

10. The vertical cavity surface emitting laser element according to claim 1, wherein the first cladding layer is a p-type cladding layer.

11. The vertical cavity surface emitting laser element according to claim 10, further comprising
a constriction layer, wherein
the intermediate layer is between the first cladding layer and the constriction layer.

12. The vertical cavity surface emitting laser element according to claim 11, further comprising
a second cladding layer between the constriction layer and the intermediate layer, and
the second cladding layer is a p-type cladding layer.

13. The vertical cavity surface emitting laser element according to claim 11, further comprising:
an n-type DBR (Distributed Bragg Reflector) layer;
a p-type DBR (Distributed Bragg Reflector) layer; and
an n-type cladding layer between the n-type DBR layer and the active layer, wherein
the constriction layer is between the p-type DBR layer and the intermediate layer.

14. An electronic apparatus, comprising:
a vertical cavity surface emitting laser element, including
an active layer,
a first cladding layer on the active layer, wherein
the first cladding layer is in direct contact with the active layer, and
a material of the first cladding layer includes AlGaInP; and
an intermediate layer on the first cladding layer, wherein
the intermediate layer is in direct contact with the first cladding layer,
a material of the intermediate layer is different from the material of the first cladding layer,
the material of the intermediate layer has potential of electrons higher than that of AlGaInP, and
the material of the intermediate layer has potential of holes higher than that of AlGaInP.

\* \* \* \* \*